United States Patent
Yoneda et al.

(10) Patent No.: US 12,297,354 B2
(45) Date of Patent: May 13, 2025

(54) RESIN COMPOSITION, COPPER FOIL WITH RESIN, DIELECTRIC LAYER, COPPER-CLAD LAMINATE, CAPACITOR ELEMENT, AND PRINTED WIRING BOARD WITH BUILT-IN CAPACITOR

(71) Applicant: MITSUI MINING & SMELTING CO., LTD., Tokyo (JP)

(72) Inventors: Yoshihiro Yoneda, Ageo (JP); Toshihiro Hosoi, Ageo (JP); Kenshiro Fukuda, Ageo (JP); Toshifumi Matsushima, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 845 days.

(21) Appl. No.: 16/966,570

(22) PCT Filed: Jan. 18, 2019

(86) PCT No.: PCT/JP2019/001502
§ 371 (c)(1),
(2) Date: Jul. 31, 2020

(87) PCT Pub. No.: WO2019/150994
PCT Pub. Date: Aug. 8, 2019

(65) Prior Publication Data
US 2020/0362169 A1    Nov. 19, 2020

(30) Foreign Application Priority Data
Feb. 1, 2018   (JP) ................................ 2018-016464

(51) Int. Cl.
*C08L 79/08*   (2006.01)
*C08K 3/22*   (2006.01)
(Continued)

(52) U.S. Cl.
CPC ............... *C08L 79/08* (2013.01); *C08K 3/22* (2013.01); *C08K 5/18* (2013.01); *C08L 63/00* (2013.01);
(Continued)

(58) Field of Classification Search
CPC ............ C08L 63/00–10; C08L 79/08; C09D 163/00–10; C09D 179/08;
(Continued)

(56) References Cited

U.S. PATENT DOCUMENTS

2005/0069715 A1* 3/2005 Hayakawa ........... C08G 59/063
528/421
2007/0083017 A1    4/2007 Dueber et al.
(Continued)

FOREIGN PATENT DOCUMENTS

CN    001914246 A    2/2007
CN    101523588 A    9/2009
(Continued)

OTHER PUBLICATIONS

Partial machine translation of JP-2003105205-A (2003).*
(Continued)

*Primary Examiner* — Kregg T Brooks
(74) *Attorney, Agent, or Firm* — GREENBLUM & BERNSTEIN, P.L.C.

(57) ABSTRACT

A resin composition for use in a dielectric layer of a capacitor is provided that can control a decrease in capacitance or dielectric constant at high temperature and ensure high dielectric characteristics and high adhesion of the composition to a circuit. The resin composition contains a resin component containing an epoxy resin, a diamine compound, and a polyimide resin; and a dielectric filler composed of a metal oxide containing at least two elements selected from the group consisting of Ba, Ti, Sr, Pb, Zr, La,
(Continued)

Ta, and Bi. The content of the dielectric filler is 60 to 85 parts by weight on the basis of 100 parts by weight of solid content in the resin composition.

14 Claims, 1 Drawing Sheet

(51) Int. Cl.
*C08K 5/18* (2006.01)
*C08L 63/00* (2006.01)
*H01B 3/40* (2006.01)
*H05K 1/05* (2006.01)

(52) U.S. Cl.
CPC .............. *H01B 3/40* (2013.01); *H05K 1/056* (2013.01); *C08K 2003/2237* (2013.01); *H05K 2201/0154* (2013.01); *H05K 2201/0179* (2013.01); *H05K 2201/0187* (2013.01); *H05K 2201/0218* (2013.01)

(58) Field of Classification Search
CPC .............. C09J 163/00–10; C09J 179/08; C08J 2463/00–10; C08J 2379/08; C08J 2479/08; H05K 1/0231; C08G 59/50–60; C08K 2003/2206; C08K 2003/2234; C08K 2003/2237; C08K 2003/2244
See application file for complete search history.

(56) References Cited

U.S. PATENT DOCUMENTS

| | | | |
|---|---|---|---|
| 2008/0230261 A1 | 9/2008 | Tanaka et al. | |
| 2009/0073636 A1 | 3/2009 | Pramanik et al. | |
| 2011/0108309 A1* | 5/2011 | Peiffer | H05K 1/162 |
| | | | 523/400 |

FOREIGN PATENT DOCUMENTS

| | | | |
|---|---|---|---|
| CN | 101855074 A | | 10/2010 |
| JP | 2003105205 A | * | 4/2003 |
| JP | 2004035858 A | * | 2/2004 |
| JP | 2006-165400 | | 6/2006 |
| JP | 2007-231125 | | 9/2007 |
| JP | 4148501 | | 9/2008 |
| JP | 2009-511717 | | 3/2009 |
| JP | 2009-242670 | | 10/2009 |
| JP | 2010-539285 | | 12/2010 |
| JP | 2014-201829 A | | 10/2014 |
| JP | 2015-061938 A | | 4/2015 |
| JP | 2015-062221 A | | 4/2015 |
| WO | 2009/008471 | | 1/2009 |

OTHER PUBLICATIONS

Partial machine translation of JP-2004035858-A (Year: 2004).*
Partial machine translation of JP 2007-231125 A (Year: 2007).*
Taiwanese Office Action, Taiwanese Patent Office, Application No. 108102812, issued Sep. 16, 2020, English translation.
International Search Report issued in International Patent Application No. PCT/JP2019/001502, dated Apr. 23, 2019 with English Translation.
Written Opinion issued in International Patent Application No. PCT/JP2019/001502, dated Apr. 23, 2019 with English Translation.
International Preliminary Report on Patentability issued in International Patent Application No. PCT/JP2019/001502, dated Aug. 4, 2020 with English Translation.
Japanese Office Action, Japanese Patent Office, Application No. 2019-569002, issued Dec. 28, 2019, English translation.
Office Action issued in CN Patent Application No. 201980005699.1, Feb. 27, 2023, translation.
"Electromagnetism", 1st edition, editor: Hou Jianguo, published by University of Science and Technology of China, Aug. 2014, p. 101, (discussed in English translation of CN Office Action above).

* cited by examiner

RESIN COMPOSITION, COPPER FOIL WITH RESIN, DIELECTRIC LAYER, COPPER-CLAD LAMINATE, CAPACITOR ELEMENT, AND PRINTED WIRING BOARD WITH BUILT-IN CAPACITOR

TECHNICAL FIELD

The present invention relates to a resin composition, a resin-coated copper foil, a dielectric layer, a copper-clad laminate, a capacitor device, and a capacitor-embedded printed circuit board.

BACKGROUND ART

Resin compositions are known that are used for production of copper-clad laminates and capacitor-embedded printed circuit boards. Such resin compositions function as dielectric layers of capacitors after being cured. For example, Patent Document 1 (JP4148501B) discloses a resin composition for capacitor-embedded printed circuit boards. The composition comprises 20 to 80 parts by weight of epoxy resin and 20 to 80 parts by weight of aromatic polyamide resin on the basis of 100 parts by weight of resin component; and 75 to 85 wt % dielectric filler on the basis of 100 wt % resin composition. Patent Document 2 (WO2009/008471) discloses another resin composition for capacitor-embedded printed circuit boards. The composition comprises 25 to 60 parts by weight of epoxy resin, 28 to 60 parts by weight of active ester resin, and 1 to 20 parts by weight of poly(vinyl acetal) resin on the basis of 100 parts by weight of resin component; and 65 to 85 wt % dielectric filler on the basis of 100 wt % resin composition. Patent Document 3 (JP2007-231125A) discloses a thermosetting resin composition that is suitable for production of, for example, a flexible print circuit board required for a low dielectric constant and a low dielectric loss tangent in a GHz frequency band and contains a polyimide resin component, an epoxy resin component, an epoxy curing agent component, and a filler component, where a preferred filler is silica. Patent Document 4 (JP2010-539285A) discloses a composite material that contains a mixture of a polymeric component, such as epoxy polymer, and a particulate ferroelectric ceramic and is used in a capacitor, where the particulate ferroelectric ceramic is, for example, barium titanate.

CITATION LIST

Patent Documents

Patent Document 1: JP4148501B
Patent Document 2: WO2009/008471
Patent Document 3: JP2007-231125A
Patent Document 4: JP2010-539285A

SUMMARY OF INVENTION

Meanwhile, printed circuit boards have been broadly used in electronic communication devices, for example, portable electronic devices. In particular, recent trends toward weight saving, thinning, and high functionality in portable electronic communication devices require reductions in noises generated in printed circuit boards. Capacitors are vital for reductions in noises. Such capacitors should preferably be thin and compact enough to be embedded into inner layers of printed circuit boards for achievement of high functionality. The capacitors are also desired to maintain stable capacitances even in severe environments at high temperature.

In order to achieve high functionality of electronic communication devices, for example, portable electronic devices, it is preferred to control a decrease in capacitance or dielectric constant of a capacitor embedded in a printed circuit board at high temperature. For this purpose, a further improvement in the resin layer or dielectric layer of a capacitor is required. High adhesion is also preferred between the resin layer and a circuit (i.e., the adhesion of the resin layer to the circuit).

The present inventors have discovered that by using a resin composition containing, in a predetermined proportion, an epoxy resin, a diamine compound, a polyimide resin, and a dielectric filler in a dielectric layer of a capacitor, it is possible to control a decrease in capacitance or dielectric constant at high temperature while ensuring high dielectric characteristics and high adhesion of the dielectric layer to a circuit.

An object of the present invention is to provide a resin composition for use in a dielectric layer of a capacitor in which the composition can control a decrease in capacitance or dielectric constant at high temperature and ensures high dielectric characteristics and high adhesion of the composition to a circuit.

According to an aspect of the present invention, there is provided a resin composition comprising:
  a resin component comprising an epoxy resin, a diamine compound, and a polyimide resin; and
  a dielectric filler composed of a complex metal oxide comprising at least two elements selected from the group consisting of Ba, Ti, Sr, Pb, Zr, La, Ta, and Bi, the content of the dielectric filler being 60 to 85 parts by weight on the basis of 100 parts by weight of solid content in the resin composition.

According to another aspect of the present invention, there is provided a resin-coated copper foil comprising a copper foil and the resin composition, the resin composition being provided on at least one side of the copper foil.

According to another aspect of the present invention, there is provided a dielectric layer comprising the resin composition that is cured.

According to another aspect of the present invention, there is provided a copper-clad laminate comprising, in sequence, a first copper foil, the dielectric layer, and a second copper foil.

According to another aspect of the present invention, there is provided a capacitor device comprising the dielectric layer.

According to another aspect of the present invention, there is provided a capacitor-embedded printed circuit board comprising the dielectric layer.

According to another aspect of the present invention, there is provided a method of producing a resin-coated copper foil, comprising:
  coating a copper foil with a resin composition comprising
    a resin component comprising an epoxy resin, a diamine compound, and a polyimide resin; and a dielectric filler composed of a complex metal oxide comprising at least two elements selected from the group consisting of Ba, Ti, Sr, Pb, Zr, La, Ta, and Bi, the content of the dielectric filler being 60 to 85 parts by weight on the basis of 100 parts by weight of solid content in the resin composition; and drying the resin composition.

DESCRIPTION OF EMBODIMENTS

Resin Composition

A resin composition according to the present invention contains a resin component and a dielectric filler. The resin component contains an epoxy resin, a diamine compound, and a polyimide resin. The dielectric filler is composed of a complex metal oxide containing at least two elements selected from the group consisting of Ba, Ti, Sr, Pb, Zr, La, Ta, and Bi. The content of the dielectric filler is 60 to 85 parts by weight on the basis of 100 parts by weight of solid content in the resin composition. The resin composition containing, in a predetermined proportion, the epoxy resin, the diamine compound, the polyimide resin, and the dielectric filler can be used in a dielectric layer of a capacitor to ensure high dielectric characteristics and high adhesion of the dielectric layer to a circuit without a decrease in capacitance or dielectric constant of the capacitor at high temperature. The dielectric layer, containing the resin composition according to the invention, has a high intrinsic capacitance. This capacitance is unlikely to decrease even at high temperature. Furthermore, the dielectric layer, containing the resin composition according to the invention, has high adhesion to the circuit and is unlikely to cause peeling from the circuit.

Any epoxy resin having two or more epoxy groups per molecule and usable in electric and electronic materials can be used. The content of the epoxy resin in the resin composition is preferably 15 to 80 parts by weight, more preferably 40 to 65 parts by weight, further preferably 45 to 60 parts by weight, on the basis of 100 parts by weight of resin component. Examples of the epoxy resin include bisphenol A epoxy resins, bisphenol F epoxy resins, bisphenol S epoxy resins, phenol novolak epoxy resins, biphenyl novolak epoxy resins, cresol novolak epoxy resins, alicyclic epoxy resins, glycidyl amine epoxy resins, naphthalene epoxy resins, anthracene epoxy resins, dicyclopentadiene epoxy resins, and any combination thereof. From the viewpoint of ensuring high heat resistance of the cured product, aromatic epoxy resins or polyfunctional epoxy resins are preferred, and phenol novolak epoxy resins, naphthalene epoxy resins, cresol novolak epoxy resins and biphenyl novolak epoxy resins are more preferred.

The diamine compound serves as a curing agent in the epoxy resin. Any diamine compound having two amino groups per molecule and usable in electric and electronic materials can be used. The content of the diamine compound in the resin composition of the present invention is determined such that the number of active hydrogen groups in the diamine compound is preferably 0.5 to 1.5, more preferably 0.8 to 1.2, further preferably 0.9 to 1.1, if the number of epoxy groups in the epoxy resin is set to 1. In this context, "the number of epoxy groups in the epoxy resin" is calculated by dividing the mass of the solid content of the epoxy resin in the resin component by the epoxy equivalent. "The number of active hydrogen groups in the diamine compound" is calculated by dividing the mass of the solid content of the diamine compound in the resin component by the active hydrogen equivalent. Examples of the diamine compound include 3,4'-diaminodiphenyl sulfide, 4,4'-diaminodiphenyl sulfide, 3,4'-diaminodiphenyl ether, 4,4'-diaminodiphenyl ether, 3,4'-diaminodiphenyl sulfone, 4,4'-diaminodiphenyl sulfone, bis[4-(4-aminophenoxy)phenyl] sulfone, bis[4-(3-aminophenoxy)phenyl] sulfone, bis(4-aminophenoxy)biphenyl, bis[4-(4-aminophenoxy)phenyl] ether, 1,4-bis(4-aminophenoxy)benzene, 1,3-bis(4-aminophenoxy)benzene, 2,2-bis[4-(4-aminophenoxy)phenyl] hexafluoropropane, 2,2-bis[4-(4-aminophenoxy)phenyl] propane,1,3-bis(aminomethyl)cyclohexane, andanycombination thereof. Preferred are 4,4'-diaminodiphenyl sulfone, bis[4-(3-aminophenoxy)phenyl] sulfone, and 2,2-bis[4-(4-aminophenoxy)phenyl]propane.

In order to promote the reaction of the resin, a curing accelerator can be added to the resin composition. Preferred examples of the curing accelerator include imidazole curing accelerators and amine curing accelerators. The content of the curing accelerator is preferably 0.01 to 3 parts by weight, more preferably 0.1 to 2 parts by weight on the basis of 100 parts by weight of non-volatile component contained in the resin composition from the viewpoint of the stability in preservation of the resin composition and the efficiency in curing.

The imidazole curing accelerator after curing reaction with the epoxy resin is taken into the molecular structure as part of the epoxy resin without being released in the form of ions, resulting in improved dielectric characteristics and insulation reliability of the resin layer. The content of the imidazole curing accelerator is not restricted. The amount for desirable curing can be appropriately determined in view of various conditions, such as composition of the resin layer. Examples of imidazole curing accelerators include 2-undecylimidazole, 2-heptadecylimidazole, 2-ethyl-4-methylimidazole, 2-phenyl-4-methylimidazole, 1-cyanoethyl-2-undecylimidazole, 1-cyanoethyl-2-ethyl-4-methyl-imidazole, 2-ethyl-4-methylimidazole, 1-cyanoethyl-2-phenylimidazole, 2-phenyl-4,5-dihydroxymethylimidazole, 2-phenyl-4-methyl-5-hydroxymethylimidazole, 2-methylimidazole, 1,2-dimethylimidazole, 2-phenylimidazole, 1-benzyl-2-methylimidazole, 1-benzyl-2-methylimidazole, 1-benzyl-2-phenylimidazole, 1-cyanoethyl-2-methylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2,3-dihydro-1H-pyrrolo[1,2-a]benzimidazole, 1-dodecyl-2-methyl-3-benzylimidazolium chloride, 2-methylimidazoline, 2-phenylimidazoline, and any combination thereof. Preferred examples of imidazole curing accelerators include 2-methylimidazole, 2-ethyl-4-methylimidazole, 2-phenyl-4-methylimidazole, and 2-phenyl-4-methyl-5-hydroxymethylimidazole. Among them, more preferred examples are imidazole curing accelerators having a phenyl group, such as 2-phenyl-4-methylimidazole and 2-phenyl-4-methyl-5-hydroxymethylimidazole, from the viewpoint of chemical stability in a semi-cured (B stage) of the resin layer. Among them, 2-phenyl-4-methyl-5-hydroxymethyl-imidazole is particularly preferred.

Examples of amine curing accelerators include trialkylamine, such as triethylamine and tributylamine, 4-dimethylaminopyridine, benzyldimethylamine, 2,4,6,-tris(dimethylaminomethyl)phenol,1,8-diazabicyclo(5,4,0)-undecene,andanycombination thereof.

The polyimide resin contributes to a reduction in dielectric loss tangent. The content of the polyimide resin in the resin composition is preferably 10 to 60 parts by weight, more preferably 20 to 40 parts by weight, further preferably 30 to 40 parts by weight, on the basis of 100 parts by weight of resin component. Such ranges can exhibit superior dielectric characteristics while maintaining high heat resistance. The polyimide resin may be preferably a polyimide resin soluble in an organic solvent (hereinafter, referred to an organic solvent-soluble polyimide resin) that can achieve desired dielectric characteristics, adhesiveness and heat resistance, the organic solvent-soluble polyimide resin being suitably compatible with an epoxy resin to form a varnish and a coating. The organic solvent in which the polyimide resin can be dissolved preferably has a solubility parameter (SP value) of 7.0 to 17.0. Preferred examples of the organic solvents include methyl ethyl ketone, toluene, xylene, N-methyl pyrrolidone, dimethylacetamide, dimethylformamide, cyclopentanone, cyclohexanone, cyclohexane, methylcyclohexane, ethylene glycol, ethylene glycol dimethyl ether, ethylene glycol acetate, and any combination thereof. In particular, any organic solvent that has at least one functional group capable of reacting with an epoxy group at the molecular end may be preferably used in order to maintain the heat resistance after curing. Specifically, the polyimide resin preferably has at least one functional moiety selected from the group consisting of carboxyl, sulfonic acid, thiol, and phenolic hydroxyl moieties at its ends or in its side chains. Such functional moieties in the polyimide resin can maintain the thermal resistance of the polyimide resin while improving the solubility in the organic solvent and the compatibility with the epoxy resin. Among the functional moieties described above, it is more preferred to use a polyimide resin having a carboxyl moiety at its ends or in its side chains.

The organic solvent-soluble polyimide resin is preferably produced through an imidization reaction between a tetracarboxylic dianhydride and a diamine compound. Examples of the tetracarboxylic dianhydrides include 2,2-bis(3,4-dicarboxyphenyl)propane dianhydride, 2,2-bis(2,3-dicarboxyphenyl)propane dianhydride, bis(3,4-dicarboxyphenyl)sulfone dianhydride, bis(3,4-dicarboxyphenyl) ether dianhydride, 2,2-bis(3,4-dicarboxyphenyl)hexafluoropropane dianhydride, 2,2-bis[4-(3,4-dicarboxyphenyl)phenyl]propane dianhydride, pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, 1,2,5,6-naphthalenetetracarboxylic dianhydride, 2,3,6,7-naphthalenetetracarboxylic dianhydride, 2,3,5,6-pyridinetetracarboxylic dianhydride, 3,4,9,10-perylenetetracarboxylic dianhydride, or compounds optionally substituted by alkyl groups and/or halogen atoms in the aromatic rings, and any combination thereof. It is preferred to use a polyimide resin produced mainly with 2,2-bis(3,4-dicarboxyphenyl)hexafluoropropane dianhydride, 2,2-bis[4-(3,4-dicarboxyphenyl)phenyl]propane dianhydride, 2,3,3',4'-biphenyltetracarboxylic dianhydride, or 2,2',3,3'-biphenyltetracarboxylic dianhydride among these compounds in order to improve the heat resistance of the resin composition. Examples of the diamine compound are as described above.

In particular, the resin composition of the present invention contains a polyimide resin that exhibits, preferably a dielectric constant of 2.0 to 5.0 and a dielectric loss tangent of 0.0005 to 0.010, more preferably a dielectric constant of 2.0 to 4.0 and a dielectric loss tangent of 0.001 to 0.005, at a frequency of 1 GHz, as characteristics in the polyimide resin itself.

The dielectric filler is a component imparting a desired high capacitance to the resin composition constituting the dielectric layer and is composed of a complex metal oxide containing at least two elements selected from the group consisting of Ba, Ti, Sr, Pb, Zr, La, Ta, and Bi. Preferred examples of the complex metal oxide include $BaTiO_3$, $SrTiO_3$, $Pb(Zr,Ti)O_3$, $PbLaTiO_3$, $PbLaZrO$, $SrBi_2Ta_2O$, and any combination thereof, which have high capacitances and can be compounded into the resin composition of the present invention. $BaTiO_3$ is more preferred. It should be noted that $Pb(Zr,Ti)O_3$ indicates $Pb(Zr_xTi_{1-x})O_3$, where $0 \leq x \leq 1$, typically $0 < x < 1$. The content of the dielectric filler in the resin composition is 60 to 85 parts by weight, preferably 70 to 85 parts by weight, more preferably 75 to 85 parts by weight, on the basis of 100 parts by weight of solid content in the resin composition. Although particles in the dielectric filler may have any diameter, the mean diameter $D_{50}$ ranges preferably from 0.01 to 2.0 μm, more preferably from 0.05 to 1.0 μm, further preferably 0.1 to 0.5 μm from the viewpoint of maintaining the adhesion of the resin composition to a copper foil. The mean diameter $D_{50}$ is measured by particle size distribution analysis with laser diffraction/scattering.

The resin composition may further comprise an optional filler dispersant. The filler dispersant can enhance the dispersion of the dielectric filler when a resin varnish is kneaded with the dielectric filler. Any known filler dispersant may be appropriately used. Examples of the preferred filler dispersants include ionic dispersants, e.g., phosphonic, cationic, carboxylic, and anionic dispersants; and nonionic dispersants, e.g., ether, ester, sorbitan ester, diester, monoglyceride, ethylene oxide adducts, ethylenediamine, and phenol dispersants. Other examples of the filler dispersants include coupling agents, such as silane coupling agents, titanate coupling agents, and aluminate coupling agents.

Resin-Coated Copper Foil

The resin composition of the present invention is preferably used in a resin-coated copper foil. Such a preformed resin-coated copper foil permits efficient production of a capacitor device and a capacitor-embedded printed circuit board without separate formation of a resin layer or dielectric layer. In other words, a preferred embodiment according to the present invention provides a resin-coated copper foil including a copper foil and a layer of a resin composition provided on at least one side of the copper foil. The resin composition is typically in the form of a layer. The copper foil may be coated with the resin composition by gravure coating and dried such that the resin layer on the copper foil has a predetermined dried thickness. A resin-coated copper foil is thereby prepared. Any coating technique other than gravure coating, such as die coating and knife coating, may be employed. In addition, coating of the resin composition using a doctor blade and a bar coater may be employed. The resin composition for the resin-coated copper foil is preferably semi-cured because two resin-coated copper foils are laminated such that the layers of the resin composition face each other in the formation of a dielectric layer.

As long as a desired capacitance can be ensured after the resin layer or dielectric layer is integrated into a capacitor, the resin layer may have any thickness. The resin layer has a thickness of preferably 0.1 to 15 µm, more preferably 0.2 to 10 µm, particularly preferably 0.5 to 5 µm, most preferably 1 to 3 µm. The resin layer having a thickness within these ranges is advantageous in that such a thickness readily achieves a high capacitance, allows ready formation of the resin layer by application of the resin composition, and readily ensures sufficient adhesion to the copper foil.

The copper foil may be a metal foil as electrodeposited or rolled (so-called raw foil), or may be surface-treated foil at least one surface of which is treated. Various surface treatments may be employed for improving the properties (for example, rust-proofing resistance, moisture resistance, chemical resistance, acid resistance, heat resistance, and adhesion to the substrate) of the surface of the metal foil or imparting these properties to the surface of the metal foil. The surface treatment may be performed on one surface or two surfaces of the metal foil. Examples of the surface treatment on the copper foil include rust-proofing treatment, silane treatment, roughening treatment, and barrier-forming treatment.

The surface, adjacent to the resin layer, of the copper foil has a ten-point average roughness Rzjis of preferably 2.0 µm or less, more preferably 1.5 µm or less, further preferably 1.0 µm or less, particularly preferably 0.5 µm or less, measured in accordance with JIS B 0601-2001. The roughness in such ranges can reduce the thickness of the resin layer. The lower limit of the ten-point average roughness Rzjis of the surface, adjacent to the resin layer, of the copper foil is not defined. From the viewpoint of improving the adhesion to the resin layer, Rzjis is preferably 0.005 µm or more, more preferably 0.01 µm or more, still more preferably 0.05 µm or more.

The copper foil has any thickness, preferably a thickness of 0.1 to 100 µm, more preferably 0.5 to 70 µm, further preferably 2 to 70 µm, particularly preferably 10 to 70 µm, most preferably 10 to 35 µm. The copper foil having a thickness within such a range allows adoption of a common patterning processes for wiring on printed circuit board including MSAP (modified semi-additive process), SAP (semi-additive process), and subtractive process. However, in such a case as the copper foil has a thickness of 10 µm or less, the resin-coated copper foil of the present invention may be prepared by forming a resin layer on the copper foil surface of a copper foil with a carrier having a release layer in order to improve the handling properties.

Dielectric Layer

The resin composition according to the present invention is preferably cured into a dielectric layer. In other words, a preferred embodiment according to the present invention provides a dielectric layer comprising the resin composition according to the present invention that is cured. The resin composition may be cured by any known technique, preferably hot vacuum pressing. As long as a desired capacitance can be ensured, the dielectric layer may have any thickness. The dielectric layer has a thickness of preferably 0.2 to 30 µm, more preferably 0.5 to 20 µm, particularly preferably 1 to 10 µm, most preferably 2 to 6 µm. The resin layer having a thickness within these ranges is advantageous in that such a thickness readily achieves a high capacitance, allows ready formation of the resin layer by application of the resin composition, and readily ensures sufficient adhesion to the copper foil.

Copper-Clad Laminate

The resin composition according to the present invention or the dielectric layer composed of the resin composition is preferably applied to a copper-clad laminate. In other words, a preferred embodiment according to the present invention provides a copper-clad laminate provided with a first copper foil, the above-mentioned dielectric layer, and a second copper foil in sequence. The copper-clad laminate in this form permits production of preferred capacitor devices and capacitor-embedded printed circuit boards that are provided with the dielectric layer composed of the resin composition according to the present invention. The copper-clad laminate may be produced by any method. For example, the copper-clad laminate can be produced by laminating two copper foils such that the resin layers face each other and curing the resin layers by hot vacuum pressing.

Capacitor Device and Capacitor-Embedded Printed Circuit Board

The resin composition according to the present invention or the dielectric layer comprising the resin composition is preferably integrated into a capacitor device. In other words, a preferred embodiment according to the present invention provides a capacitor device provided with the above-mentioned dielectric layer. The capacitor device may have any configuration including a known configuration. A particularly preferred embodiment is a capacitor-embedded printed circuit board provided with an inner layer integrated with the dielectric layer serving as a capacitor. In other words, the particularly preferred embodiment according to the present invention provides a capacitor-embedded printed circuit board provided with the aforementioned dielectric layer. Specifically, the resin-coated copper foil according to the invention permits efficient production of capacitor devices and capacitor-embedded printed circuit boards by a known technique.

EXAMPLES

The present invention will now be described in more detail in reference to the following examples.

Examples 1 to 25

(1) Preparation of Resin Varnish

Raw materials prepared for resin varnishes were the following resins, imidazole curing accelerator, dielectric filler, and dispersant:
  Epoxy resin: biphenyl epoxy resin NC-3000H (biphenyl aralkyl type, epoxy equivalent: 288 g/Eq) available from Nippon Kayaku Co. Ltd.
  Diamine compound: BAPP (2,2-bis[4-(4-aminophenoxy) phenyl]propane, active hydrogen equivalent: 102 g/Eq) available from Wakayama Seika Kogyo Co., Ltd.
  Active ester resin: HPC-8000-65T (active ester equivalent: 223 g/Eq) available from DIC Corporation Phenolic resin: MEH-7500 (hydroxyl equivalent: 95 g/Eq) available from Meiwa Plastic Industries, Ltd.

Aromatic polyamide resin: BPAM-155 (polybutadiene-modified aromatic polyamide resin containing phenolic hydroxyl groups) available from Nippon Kayaku Co. Ltd.

Polyimide resin: PIAD-301 (terminal functional group: carboxyl group, solvent: mixture of cyclohexanone, methylcyclohexane, and ethylene glycol dimethyl ether, dielectric constant (1 GHz): 2.70, dielectric loss tangent (1 GHz): 0.003) available from Arakawa Chemical Industries, Ltd.

Butyral resin: KS-5Z available from SEKISUI CHEMICAL CO., LTD.

Imidazole curing accelerator: 2P4MHZ (additive amount: 1.0 wt % on the basis of 100 wt % resin component) available from Shikoku Chemicals Corporation Dielectric filler: AKBT-S ($BaTiO_3$, mean particle diameter $D_{50}$=0.3 µm as measured by particle size distribution analysis with laser diffraction/scattering) available from Nippon Chemical Industry Co., Ltd.

Dispersant: titanate coupling agent KR-44 available from Ajinomoto Fine-Techno Co., Ltd.

Raw materials for resin varnishes were weighed in the proportion by weight in each example shown in Tables 1 to 3. Cyclopentanone solvent was then weighed. The raw materials for the resin varnishes and the cyclopentanone solvent were placed in a flask and stirred at 60° C. The resulting resin varnishes were confirmed to be transparent and then the resin varnishes were stocked.

(2) Kneading of Resin Varnish with Filler

A cyclopentanone solvent, a dielectric filler, and a dispersant were weighed. The weighed cyclopentanone solvent, dielectric filler, and filler dispersant were agitated with a disperser into slurry. After the formation of the slurry was confirmed, the resin varnish was weighed and kneaded into the slurry containing the dielectric filler in a disperser to yield a resin composition.

(3) Coating with Resin

Figure 1:
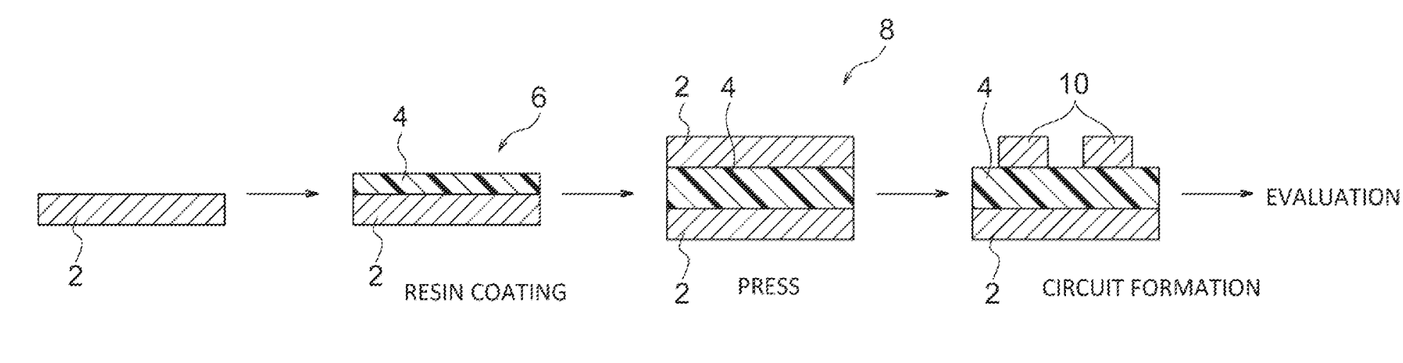
FIG. 1 illustrates a process of manufacturing a resin-coated copper foil, a copper-clad laminate, and a circuit for evaluation in Examples 1 to 25.

As illustrated in FIG. 1, the resultant resin composition 4 was applied to a copper foil 2 (available from Mitsui Mining & Smelting Co., Ltd. and having a thickness of 18 µm and a surface roughness Rzjis of 0.5 µm) with a bar coater such that the layer of the resin composition after being dried had a thickness of 1.5 µm. The copper foil was subsequently dried in an oven heated to 160° C. for 3 minutes to semicure the resin composition. A resin-coated copper foil 6 was thereby prepared.

(4) Press

As illustrated in FIG. 1, two resin-coated copper foils 6 were laminated such that the layers of the resin composition 4 faced each other. This laminate was subjected to vacuum press at a pressure of 40 kgf/cm$^2$ and 200° C. for 90 minutes. The resin composition 4 was cured thereby. In this manner, a copper-clad laminate 8 was prepared that provided with a dielectric layer composed of the cured resin composition 4 and having a thickness of 3.0 µm.

(5) Formation and Test of Circuit Pattern

One side of each resultant copper-clad laminate 8 was etched to form a circuit 10 for various tests. The following tests were performed.

Test 1: Peel Strength

One side of each copper-clad laminate 8 was etched to form a linear circuit pattern 10 with a width of 10 mm. The circuit pattern 10 was then peeled with an autograph tensile tester at a peeling rate of 50 mm/minute for measurement of the peel strength. The peel strength was measured in accordance with IPC-TM-650 2.4.8. Measured peel strengths were evaluated based on the following criteria. Tables 1 to 3 show the results.
Rating A: 0.6 kgf/cm or more (good)
Rating B: 0.4 kgf/cm or more and less than 0.6 kgf/cm (acceptable)
Rating C: Less than 0.4 kgf/cm (rejected)

Test 2: Measurement of Capacitance

One side of each copper-clad laminate 8 was etched to form a circular circuit pattern 10 with a diameter of 0.5 inches (12.6 mm). The capacitance of the copper-clad laminate was measured at a frequency of 1 kHz with an LCR meter (LCR HiTESTER 3532-50 available from Hioki E.E. Corporation) in accordance with IPC-TM-650 2.5.2. Tables 1 to 3 show the results.
Rating A: 40 nF/in$^2$ or more (good)
Rating B: 20 nF/in$^2$ or more and less than 40 nF/in$^2$ (acceptable)
Rating C: less than 20 nF/in$^2$ (rejected)

Test 3: Rate of Decline in Capacitance after Heat Treatment

Samples that had been subjected to Test 2 were heated at 230° C. for 110 minutes in an oven. The capacitances of the samples were remeasured. The rates of declines in capacitances after the heat treatment were calculated. The same heat treatment was repeated. The rates of declines in capacitances after the third heat treatment were calculated. The calculated rates of declines in capacitances were evaluated on the following criteria. Tables 1 to 3 show the results.
Rating A: less than 2% (good)
Rating B: 2% or more and less than 5% (acceptable)
Rating C: 5% or more (rejected)

<Test 4: Measurement of Dielectric Loss Tangent>

One side of each copper-clad laminate 8 was etched to form a circular circuit pattern 10 with a diameter of 0.5 inches (12.6 mm). The dielectric loss tangent at a frequency of 1 kHz was measured with an LCR meter (LCR HiTESTER 3532-50 available from Hioki E.E. Corporation) in accordance with IPC-TM-650 2.5.2. Tables 1 to 3 show the results.
Rating A: less than 0.010 (good)
Rating B: 0.010 or more and less than 0.020 (acceptable)
Rating C: 0.020 or more (rejected)

Overall Rating

The overall rating was determined from the results of Tests 1 to 4 based on the following criteria. Tables 1 to 3 show the results.
Rating A: rating A in all the tests (good)
Rating B: no rating C in all the tests and rating B in at least one test (acceptable)
Rating C: rating C in at least one test (rejected)

TABLE 1

| Dielectric filler content: 60.0 wt % | | | | | | | | |
|---|---|---|---|---|---|---|---|---|
| | | | | Ex. 1 | Ex. 2 | Ex. 3 | Ex. 4 | Ex. 5 |
| Resin Composition | Resin components and proportion based on 100 parts by weight | Epoxy resin | NC-3000H | 67.5 | 60.0 | 52.5 | 45.0 | 37.5 |
| | | Diamine compound | BAPP | 22.5 | 20.0 | 17.5 | 15.0 | 12.5 |
| | | Active ester resin | HPC-8000-65T | — | — | — | — | — |
| | | Phenolic resin | MEH-7500 | — | — | — | — | — |
| | | Aromatic polyamide resin | BPAM-155 | — | — | — | — | — |
| | | Polyimide resin | PIAD-301 | 10.0 | 20.0 | 30.0 | 40.0 | 50.0 |
| | | Butyral resin | KS-5Z | — | — | — | — | — |
| | Content of dielectric filler based on 100 parts by weight of solid content in resin composition | | | 60.0 | 60.0 | 60.0 | 60.0 | 60.0 |
| | Number of reactive groups when number of epoxy groups in NC-3000H is set to 1 | Active hydrogen groups in BAPP | | 0.94 | 0.94 | 0.94 | 0.94 | 0.94 |
| | | Active ester groups in HPC-8000-65T | | — | — | — | — | — |
| | | Hydroxyl groups in MEH-7500 | | — | — | — | — | — |
| Results | Test 1 | Peel strength of 18 μm copper foil (kgf/cm) | | 0.8 | 0.9 | 1.1 | 1.2 | 1.4 |
| | | Rating | | A | A | A | A | A |
| | Test 2 | Capacitance at 1 KHz (nF/in$^2$) | | 29 | 27 | 24 | 22 | 22 |
| | | Rating | | B | B | B | B | B |
| | Test 3 | Decline in capacitance at 1 KHz after first heat treatment (%) | | 1.0 | 0.5 | 0.3 | 0.2 | 0.2 |
| | | Decline in capacitance at 1 KHz after third heat treatment (%) | | 2.0 | 0.7 | 0.5 | 0.4 | 0.3 |
| | | Rating | | B | A | A | A | A |
| | Test 4 | Dielectric loss tangent at 1 KHz | | 0.007 | 0.005 | 0.004 | 0.003 | 0.002 |
| | | Rating | | A | A | A | A | A |
| | Overall rating | | | B | B | B | B | B |
| | | | | Ex. 6 | Ex. 7* | Ex. 8* | Ex. 9* | |
| Resin Composition | Resin components and proportion based on 100 parts by weight | Epoxy resin | NC-3000H | 30.0 | 75.0 | 40.0 | 46.0 | |
| | | Diamine compound | BAPP | 10.0 | 25.0 | — | — | |
| | | Active ester resin | HPC-8000-65T | — | — | — | 34.0 | |
| | | Phenolic resin | MEH-7500 | — | — | 20.0 | — | |
| | | Aromatic polyamide resin | BPAM-155 | — | — | 40.0 | — | |
| | | Polyimide resin | PIAD-301 | 60.0 | — | — | — | |
| | | Butyral resin | KS-5Z | — | — | — | 20.0 | |
| | Content of dielectric filler based on 100 parts by weight of solid content in resin composition | | | 60.0 | 60.0 | 60.0 | 60.0 | |
| | Number of reactive groups when number of epoxy groups in NC-3000H is set to 1 | Active hydrogen groups in BAPP | | 0.94 | 0.94 | — | — | |
| | | Active ester groups in HPC-8000-65T | | — | — | — | 0.95 | |
| | | Hydroxyl groups in MEH-7500 | | — | — | 1.52 | — | |
| Results | Test 1 | Peel strength of 18 μm copper foil (kgf/cm) | | 1.5 | 0.9 | 0.9 | 0.8 | |
| | | Rating | | A | A | A | A | |
| | Test 2 | Capacitance at 1 KHz (nF/in$^2$) | | 21 | 31 | 25 | 16 | |
| | | Rating | | B | B | B | C | |
| | Test 3 | Decline in capacitance at 1 KHz after first heat treatment (%) | | 0.1 | 1.5 | 4.5 | 1.5 | |
| | | Decline in capacitance at 1 KHz after third heat treatment (%) | | 0.2 | 5.0 | 10.0 | 3.0 | |
| | | Rating | | A | C | C | B | |
| | Test 4 | Dielectric loss tangent at 1 KHz | | 0.001 | 0.012 | 0.020 | 0.004 | |
| | | Rating | | A | B | C | A | |
| | Overall rating | | | B | C | C | C | |

*indicates Comparative Example.

TABLE 2

| Dielectric filler content: 80.0 wt % | | | | | | | | |
|---|---|---|---|---|---|---|---|---|
| | | | | Ex. 10 | Ex. 11 | Ex. 12 | Ex. 13 | Ex. 14 |
| Resin Composition | Resin components and proportion based on 100 parts by weight | Epoxy resin | NC-3000H | 67.5 | 60.0 | 52.5 | 45.0 | 37.5 |
| | | Diamine compound | BAPP | 22.5 | 20.0 | 17.5 | 15.0 | 12.5 |
| | | Active ester resin | HPC-8000-65T | — | — | — | — | — |
| | | Phenolic resin | MEH-7500 | — | — | — | — | — |
| | | Aromatic polyamide resin | BPAM-155 | — | — | — | — | — |
| | | Polyimide resin | PIAD-301 | 10.0 | 20.0 | 30.0 | 40.0 | 50.0 |
| | | Butyral resin | KS-5Z | — | — | — | — | — |

TABLE 2-continued

Dielectric filler content: 80.0 wt %

|  |  |  |  |  |  |  |  |
|---|---|---|---|---|---|---|---|
|  | Content of dielectric filler based on 100 parts by weight of solid content in resin composition |  | 80.0 | 80.0 | 80.0 | 80.0 | 80.0 |
|  | Number of reactive groups when number of epoxy groups in NC-3000H is set to 1 | Active hydrogen groups in BAPP | 0.94 | 0.94 | 0.94 | 0.94 | 0.94 |
|  |  | Active ester groups in HPC-8000-65T | — | — | — | — | — |
|  |  | Hydroxyl groups in MEH-7500 | — | — | — | — | — |
| Results | Test 1 | Peel strength of 18 μm copper foil (kgf/cm) | 0.5 | 0.6 | 0.7 | 0.8 | 0.9 |
|  |  | Rating | B | A | A | A | A |
|  | Test 2 | Capacitance at 1 KHz (nF/in$^2$) | 46 | 43 | 41 | 40 | 39 |
|  |  | Rating | A | A | A | A | B |
|  | Test 3 | Decline in capacitance at 1 KHz after first heat treatment (%) | 1.5 | 0.9 | 0.6 | 0.4 | 0.3 |
|  |  | Decline in capacitance at 1 KHz after thrird heat treatment (%) | 3.0 | 1.4 | 0.9 | 0.7 | 0.5 |
|  |  | Rating | B | A | A | A | A |
|  | Test 4 | Dielectric loss tangent at 1 KHz | 0.010 | 0.008 | 0.005 | 0.004 | 0.003 |
|  |  | Rating | B | A | A | A | A |
|  | Overall rating |  | B | A | A | A | B |

|  |  |  |  | Ex. 15 | Ex. 16* | Ex. 17* | Ex. 18* |
|---|---|---|---|---|---|---|---|
| Resin Composition | Resin components and proportion based on 100 parts by weight | Epoxy resin | NC-3000H | 30.0 | 75.0 | 40.0 | 46.0 |
|  |  | Diamine compound | BAPP | 10.0 | 25.0 | — | — |
|  |  | Active ester resin | HPC-8000-65T | — | — | — | 34.0 |
|  |  | Phenolic resin | MEH-7500 | — | — | 20.0 | — |
|  |  | Aromatic polyamide resin | BPAM-155 | — | — | 40.0 | — |
|  |  | Polyimide resin | PIAD-301 | 60.0 | — | — | — |
|  |  | Butyral resin | KS-5Z | — | — | — | 20.0 |
|  | Content of dielectric filler based on 100 parts by weight of solid content in resin composition |  |  | 80.0 | 80.0 | 80.0 | 80.0 |
|  | Number of reactive groups when number of epoxy groups in NC-3000H is set to 1 | Active hydrogen groups in BAPP |  | 0.94 | 0.94 | — | — |
|  |  | Active ester groups in HPC-8000-65T |  | — | — | — | 0.95 |
|  |  | Hydroxyl groups in MEH-7500 |  | — | — | 1.52 | — |
| Results | Test 1 | Peel strength of 18 μm copper foil (kgf/cm) |  | 1.0 | 0.6 | 0.6 | 0.5 |
|  |  | Rating |  | A | A | A | B |
|  | Test 2 | Capacitance at 1 KHz (nF/in$^2$) |  | 38 | 49 | 44 | 34 |
|  |  | Rating |  | B | A | A | B |
|  | Test 3 | Decline in capacitance at 1 KHz after first heatntreatment (%) |  | 0.2 | 2.0 | 10.0 | 2.5 |
|  |  | Decline in capacitance at 1 KHz after thrird heat treatment (%) |  | 0.4 | 7.0 | 20.0 | 4.5 |
|  |  | Rating |  | A | C | C | B |
|  | Test 4 | Dielectric loss tangent at 1 KHz |  | 0.002 | 0.015 | 0.025 | 0.005 |
|  |  | Rating |  | A | B | C | A |
|  | Overall rating |  |  | B | C | C | B |

*indicates Comparative Example.

TABLE 3

Dielectric filler content: 80.0 wt % and variable number of active hydrogen groups in BAPP

|  |  |  |  | Ex. 19 | Ex. 20 | Ex. 21 | Ex. 22 (Ex. 12) | Ex. 23 | Ex. 24 | Ex. 25 |
|---|---|---|---|---|---|---|---|---|---|---|
| Resin Composition | Resin components and proportion based on 100 parts by weight | Epoxy resin | NC-3000H | 42.0 | 45.5 | 49.0 | 52.5 | 56.0 | 59.5 | 62.5 |
|  |  | Diamine compound | BAPP | 28.0 | 24.5 | 21.0 | 17.5 | 14.0 | 10.5 | 7.5 |
|  |  | Active ester resin | HPC-8000-65T | — | — | — | — | — | — | — |
|  |  | Phenolic resin | MEH-7500 | — | — | — | — | — | — | — |
|  |  | Aromatic polyamide resin | BPAM-155 | — | — | — | — | — | — | — |
|  |  | Polyimide resin | PIAD-301 | 30.0 | 30.0 | 30.0 | 30.0 | 30.0 | 30.0 | 30.0 |
|  |  | Butyral resin | KS-5Z | — | — | — | — | — | — | — |

TABLE 3-continued

Dielectric filler content: 80.0 wt % and variable number of active hydrogen groups in BAPP

|   |   |   | Ex. 19 | Ex. 20 | Ex. 21 | Ex. 22 (Ex. 12) | Ex. 23 | Ex. 24 | Ex. 25 |
|---|---|---|---|---|---|---|---|---|---|
|   | Content of dielectric filler based on 100 parts by weight of solid content in resin composition | | 80.0 | 80.0 | 80.0 | 80.0 | 80.0 | 80.0 | 80.0 |
|   | Number of reactive groups when number of epoxy groups in NC-3000H is set to 1 | Active hydrogen groups in BAPP | 1.88 | 1.52 | 1.21 | 0.94 | 0.71 | 0.50 | 0.34 |
|   |   | Active ester groups in HPC-8000-65T | — | — | — | — | — | — | — |
|   |   | Hydroxyl groups in MEH-7500 | — | — | — | — | — | — | — |
| Results | Test 1 | Peel strength of 18 μm copper foil (kgf/cm) | 0.5 | 0.6 | 0.7 | 0.7 | 0.7 | 0.7 | 0.7 |
|   |   | Rating | B | A | A | A | A | A | A |
|   | Test 2 | Capacitance at 1 KHz (nF/in$^2$) | 41 | 40 | 40 | 41 | 40 | 40 | 39 |
|   |   | Rating | A | A | A | A | A | A | B |
|   | Test 3 | Decline in capacitance at 1 KHz after first heat treatment (%) | 1.6 | 1.3 | 0.8 | 0.6 | 0.6 | 0.7 | 0.8 |
|   |   | Decline in capacitance at 1 KHz after third heat treatment (%) | 2.8 | 1.9 | 1.4 | 0.9 | 0.9 | 1.2 | 1.4 |
|   |   | Rating | B | A | A | A | A | A | A |
|   | Test 4 | Dielectric loss tangent at 1 KHz | 0.005 | 0.005 | 0.005 | 0.005 | 0.005 | 0.005 | 0.005 |
|   |   | Rating | A | A | A | A | A | A | A |
|   | Overall rating | | B | A | A | A | A | A | B |

*indicates Comparative Example.

The invention claimed is:

1. A resin composition comprising:
a resin component comprising an epoxy resin, a diamine compound, and a polyimide resin; and
a dielectric filler composed of a complex metal oxide comprising at least two elements selected from the group consisting of Ba, Ti, Sr, Pb, Zr, La, Ta, and Bi, the content of the dielectric filler being 70 to 85 parts by weight on the basis of 100 parts by weight of solid content in the resin composition,
wherein the content of the polyimide resin is 20 to 40 parts by weight on the basis of 100 parts by weight of the resin component,
wherein the content of the epoxy resin in the resin composition is 45 to 60 parts by weight on the basis of 100 parts by weight of resin component,
wherein the content of the diamine compound is determined such that when the number of epoxy groups in the epoxy resin is set to 1, the number of active hydrogen groups in the diamine compound is 0.5 to 1.5, and
the polyimide resin has at least one functional moiety selected from the group consisting of carboxyl, sulfonic acid, thiol, and phenolic hydroxyl moieties, at its ends or in its side chains, provided that when the functional moiety is carboxyl moiety, the polyimide resin has carboxyl moiety at terminal ends of the polyimide.

2. The resin composition according to claim 1, wherein the complex metal oxide comprises at least one selected from the group consisting of BaTiO$_3$, SrTiO$_3$, Pb(Zr, Ti)O$_3$, PbLaTiO$_3$, PbLaZrO, and SrBi$_2$Ta$_2$O$_9$.

3. The resin composition according to claim 1, wherein the complex metal oxide is BaTiO$_3$.

4. The resin composition according to claim 1, wherein the content of the diamine compound is determined such that when the number of epoxy groups in the epoxy resin is set to 1, the number of active hydrogen groups in the diamine compound is 0.8 to 1.2.

5. A resin-coated copper foil comprising a copper foil and the resin composition according to claim 1, the resin composition being provided on at least one side of the copper foil.

6. A dielectric layer comprising the resin composition according claim 1 that is cured.

7. The dielectric layer according to claim 6, wherein the dielectric layer has a thickness of 0.2 to 30 μm.

8. The dielectric layer according to claim 6, wherein the dielectric layer has a thickness of 1 to 10 μm.

9. A copper-clad laminate comprising, in sequence, a first copper foil, the dielectric layer according to claim 6, and a second copper foil.

10. A capacitor device comprising the dielectric layer according to claim 6.

11. A capacitor-embedded printed circuit board comprising the dielectric layer according to claim 6.

12. A method of producing a resin-coated copper foil, comprising:
coating a copper foil with a resin composition comprising
a resin component comprising an epoxy resin, a diamine compound, and a polyimide resin; and a dielectric filler composed of a complex metal oxide comprising at least two elements selected from the group consisting of Ba, Ti, Sr, Pb, Zr, La, Ta, and Bi, the content of the dielectric filler being 60 to 85 parts by weight on the basis of 100 parts by weight of solid content in the resin composition; and
drying the resin composition,
wherein the content of the polyimide resin is 20 to 40 parts by weight on the basis of 100 parts by weight of the resin component,
wherein the content of the epoxy resin in the resin composition is 45 to 60 parts by weight on the basis of 100 parts by weight of resin component,
wherein the content of the diamine compound is determined such that when the number of epoxy groups in the epoxy resin is set to 1, the number of active hydrogen groups in the diamine compound is 0.5 to 1.5, and the polyimide resin has at least one functional moiety selected from the group consisting of carboxyl, sulfonic acid, thiol, and phenolic hydroxyl moieties, at its ends or in its side chains, provided that when the functional moiety is carboxyl moiety, the polyimide resin has carboxyl moiety at terminal ends of the polyimide.

13. A resin composition comprising:

a resin component comprising an epoxy resin, a diamine compound, and a polyimide resin; and a dielectric filler composed of a complex metal oxide comprising at least two elements selected from the group consisting of Ba, Ti, Sr, Pb, Zr, La, Ta, and Bi, the content of the dielectric filler being 70 to 85 parts by weight on the basis of 100 parts by weight of solid content in the resin composition, wherein the content of the polyimide resin is 20 to 40 parts by weight on the basis of 100 parts by weight of the resin component, wherein the content of the epoxy resin in the resin composition is 45 to 60 parts by weight on the basis of 100 parts by weight of resin component, wherein the content of the diamine compound is determined such that when the number of epoxy groups in the epoxy resin is set to 1, the number of active hydrogen groups in the diamine compound is 0.5 to 1.5, and the polyimide resin has at least one functional moiety selected from the group consisting of sulfonic acid, thiol, and phenolic hydroxyl moieties, at its ends or in its side chains.

14. The resin composition of claim 13 wherein the polyimide resin further comprises a carboxyl moiety.

* * * * *